United States Patent [19]

Okano et al.

[11] Patent Number: 4,492,610
[45] Date of Patent: Jan. 8, 1985

[54] DRY ETCHING METHOD AND DEVICE THEREFOR

[75] Inventors: Haruo Okano, Yokohama; Yasuhiro Horiike, Tokyo, both of Japan

[73] Assignee: Tokyo Shibaura Denki Kabushiki Kaisha, Kawasaki, Japan

[21] Appl. No.: 559,857

[22] Filed: Dec. 12, 1983

Related U.S. Application Data

[63] Continuation of Ser. No. 486,456, Apr. 25, 1983, abandoned, which is a continuation of Ser. No. 324,663, Nov. 24, 1981, abandoned.

[30] Foreign Application Priority Data

Dec. 11, 1980 [JP] Japan ................ 55-173821
Sep. 25, 1981 [JP] Japan ................ 56-150801

[51] Int. Cl.³ ............... H01L 21/306; B44C 1/22; C03C 15/00; C23F 1/02
[52] U.S. Cl. ............... 156/643; 156/345; 156/646; 204/192 E; 204/298
[58] Field of Search ............ 156/345, 643, 646, 656, 156/657, 659.1, 653, 662, 665; 204/164, 192 E, 298; 219/121 PD, 121 PE, 121 PF, 121 PG, 121 PH; 313/156, 231.13, 186.03; 252/79.1; 427/38, 39; 118/715, 728, 50.1, 620, 623

[56] References Cited

U.S. PATENT DOCUMENTS

| | | | |
|---|---|---|---|
| 3,669,861 | 6/1972 | Cash et al. | 204/192 EC |
| 3,757,733 | 9/1973 | Reinberg | 204/192 E |
| 3,855,612 | 12/1974 | Rosuold | 204/192 EC |
| 3,968,018 | 7/1976 | Lane et al. | 204/192 EC |
| 4,011,143 | 3/1977 | Del Monte et al. | 204/192 EC |
| 4,094,732 | 6/1978 | Reinberg | 204/192 E |
| 4,247,383 | 1/1981 | Greue et al. | 204/298 |
| 4,312,731 | 1/1982 | Morrison | 204/298 |
| 4,384,933 | 5/1983 | Takasaki | 156/643 |

FOREIGN PATENT DOCUMENTS

0001538 4/1979 European Pat. Off. ............ 156/643

OTHER PUBLICATIONS

Vossen, ed., Thin Film Processes, Acedemic Press, New York, N.Y., (1978), pp. 48, 49, 76, 77, 107, 108, 497, 498.
Meckel et al., "Magnetron . . . Materials", Research Disclosure, (10/79), pp. 537–540.
"2400-85 A Planar Magnetron Sputtering System", Perkins-Elmer Ultek Inc., Palo Alto, Ca., (3/77).
Horiike et al., "High-Rate . . . Discharge", Jap. J. of Applied Physics, vol. 20, No. 11, (1981), pp. 817–820.
A catalogue of an apparatus for sale: Tokuda Seisakusho, Ltd.

Primary Examiner—William A. Powell
Attorney, Agent, or Firm—Oblon, Fisher, Spivak, McClelland & Maier

[57] ABSTRACT

A dry etching method and device involve induction of a magnetic field having field lines perpendicular to an electric field by magnets which are arranged in the vicinity of a cathode within a reaction chamber, on the surface of the cathode being placed a sample to be etched by a plasma of an etchant gas.

13 Claims, 13 Drawing Figures

DRY ETCHING METHOD AND DEVICE THEREFOR

This application is a continuation of application Ser. No. 486,456, filed Apr. 25, 1983, abandoned which is a contiuntion of application Ser. No. 324,663, filed Nov. 24. 1981 abandoned.

BACKGROUND OF THE INVENTION

The present invention relates to a dry etching method by which various materials are etched by etchant plasma for manufacturing a semiconductor device, and to a device used for the dry etching method.

Semiconductor integrated circuits are processed with elaborate circuit patterns. This tendency has recently increased. For example, an VLSI having a minimum pattern of 1 to 2 μm has been developed. In order to accomplish pattern dimension described above, dry etching using an etchant plasma is inevitably the etching method. In the dry etching process, an etchant, that is, a reactive gas, is introduced into a reaction chamber which has parallel plate electrodes. Power, for example, high frequency power or direct current power, is applied across the electrodes to generate a plasma with glow discharge. Positive ions within the plasma are accelerated by a cathode fall voltage in the direction of the cathode, and bombard a sample placed on the cathode thereby etching it. This dry etching process is also called reactive ion etching.

However, according to this conventional dry etching, the etching rate is very low and the etching takes long time. For example, the etching rate of $SiO_2$ is about 300 Å/min when a gas mixture of $CF_4$ and $H_2$ is used as the etchant, so that it takes about 40 minutes to etch a $SiO_2$ film which has a thicknenss of 1 μm. The etching rate of phosphorus-doped polycrystalline silicon is about 500 Å/min when a $CBrF_3$ gas is used as the etchant, so that it takes about 8 minutes to etch a phosphorus-doped polycrystalline silicon film which has a thickness of 4,000 Å. Further, the etching rate of aluminum is about 1,000 Å/min when a $CCl_4$ gas is used as the etchant, so that it takes several ten minutes to etch the aluminum film which has a thickness of 1 μm. This low etching rate essentially results from low ionizing efficiency, for example, in the range of 3 to 5% in the glow discharge between the parallel plate electrodes.

In order to increase the etching rate, the high frequency power, for example, may be increased so that the etching rate is slightly increased. However, increasing the high frequency power has drawbacks in that a great amount of the high frequency power is converted to heat, degradation of a photoresist film to be used as the etching mask occurs in accordance with an increase of the cathode fall voltage or the like, and a silicon substrate may electrically damaged. In consideration of these drawbacks, the increase in the etching rate is generally sacrificed so that the high frequency power is usually applied as low as possible. Recently, it has been reported that high-rate etching of Si and $Al_2O_3$ has been accomplished using a three-electrode power supply device with a means which supplies electrons within the plasma itself (J. Vac. Sci. Technol, 17(3), 731, by N. Heiman et al, 1980). However, in this case, a heating filament is used so that the filament is corroded by the reactive gas. This method may have a problem in continuous application for a long period of time. In order to increase the density of the etching source, a method for using a laser has been proposed (J. Electrochem. Soc. 127, 514, by J. I. Steinfeld et al, 1980). According to this method, the density of the etching source increases, and a high etching rate is accomplished. However, the etching source which has increased mainly consists of neutral radicals. Since the neutral radicals are not attracted by the cathode, directivity of the movement is uncertain. Side etching may occur, so that neutral radicals are not used for elaborate patterning of less than 1 μm.

SUMMARY OF THE INVENTION

It is the object of the present invention to provide a dry etching method by which a semiconductor material such as silicon, an insulator such as $SiO_2$, and a heat-resistant metal such as aluminum are etched at high speed without electrical damage to a substrate material; and to a device used for the dry etching method.

In order to achieve the above and other objects of the present invention, there is provided a dry etching method which includes induction of a magnetic field having lines of magnetic force perpendicular to the electric field between electrodes when a sample placed on a cathode is etched with plasma of an etchant gas.

According to the present invention, there is provided a dry etching device comprising a reaction chamber having an anode and a cathode, a means for supplying power between the electrodes to generate a plasma from an etchant gas which is introduced in the reaction chamber, and a means for inducing a magnetic field having lines of magnetic force perpendicular to the eletic field between the electrodes.

According to this dry etching method, an electron within a plasma will drift in a magnetic field perpendicular to the movement of the electron, so that the electron collides with the etchant gas. Therefore, dissociation of the etchant gas is increased. As a result, the etching source increases in density and a high etching rate is accomplished.

DETAILED DESCRIPTION OF THE PREFERRED EMBODIMENTS

Figure 1:
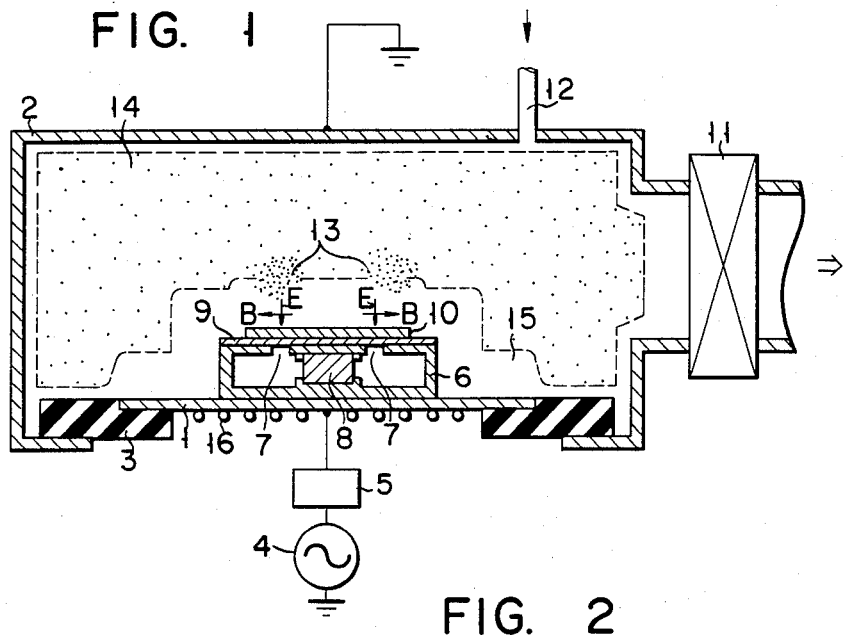
FIG. 1 ls a schematic sectional view illustrating the basic structure of a dry etching device according to the present invention.

In order to describe the action of a magnetic field in dry etching, a device in which a sample to be etched is fixed relative to a magnetic field is used as shown in FIG. 1. The device has a reaction chamber in which a cathode 1 is disposed opposite to an anode 2 and these electrodes are insulated by a spacer 3. A high frequency power source 4 is connected to the cathode 1 through a matching circuit 5. The anode is normally at ground potential. At the center of the cathode 1, a magnetic material, for example, a soft iron pole piece 6, is placed. The pole piece 6 is box-shaped and has discharge gap 7 which is constituted by closed loops of rectangular or circular shape on the upper surface of the pole piece 6. A magnet, for examle, a permanent magnet 8 of cobalt samarium, is disposed inside at the center of the pole piece 6, so that the permanent magnet 8 supports a portion of the pole piece 6 which is surrounded by the discharge gap 7. When the upper surface of the permanent magnet 8 is adopted to be the N-pole and the lower surface of the permanent magnet 8 is the S-pole, arc-shaped lines of magnetic force are generated along the discharge gap 7 of the pole piece 6. Therefore, a magnetic field having field lines B perpendicular to a direction E of an electric field is induced. The cathode 1 is cooled by a water cooling means 16.

When a sample is etched by the device of FIG. 1, a sample pallet 9 made of a nonmagnetic material, for example, carbon or alumina, is placed on the pole piece 6. A sample 10 comprising a layer to be etched and a resist etching mask formed thereon is placed on the sample pallet 9. The inside of the reaction chamber is evacuated by opening a vacuum sealing valve 11, and an etchant gas is supplied from a gas inlet port 12. High frequency power is supplied to the cathode 1. By this power, glow discharge is generated between the electrodes so that a plasma is produced from the etchant gas. A cathode fall voltage (negative current self bias) is induced at the cathode 1. In this condition, in the vicinity of the discharge gap 7, a magnetic field perpendicular to the electric field is induced. Therefore, electrons in the vicinity of the field drift in the direction $1E \times 1B$ so that the electrons are trapped in a helical drift track in the vicinity 13 of the discharge gap 7. The ionizing efficiency of the etchant gas in the vicinity 13 above the discharge gap 7 greatly increases in comparison with a surrounding space 14. In fact, the present inventors examined the thickness of a cathode dark space 15 above the cathode when a magnetic field was induced and when a magnetic field was not induced. When the magnetic field was induced, the thickness of the cathode dark space 15 became so small that it could not be seen. In the vicinity of the discharge gap 7 when the magnetic field perpendicular to the electrical field was present, the plasma density was particularly high. As a result, in comparison with the conventional DC self bias voltage, the device according to the present invention requires low power for high plasma density. This principle of operation is the basis of high speed etching, that is, the object of the present invention. In an experiment where silicon dioxide $SiO_2$ was etched using, for example, Freon gas ($CF_4$) as the etchant, high speed etching was performed, that is, the etching rate was about 1 $\mu$m/min for a $SiO_2$ film on a Si substrate under the conditions that the $CF_4$ pressure was 0.04 Torr and the high frequency power was about 250 W (Power density 0.2 to 0.25 W/cm$^2$: this value is preferable in a conventional device in which a magnetic field is not induced). Further, damage to the Si substrate was minimal. When the $SiO_2$ film was etched after a photoresist pattern was formed on the $SiO_2$ film, the etched profile of the $SiO_2$ film, that is, was examined with an electron microscope. It was confirmed anisotropic etching was accomplished since the etched $SiO_2$ film had a vertical etching wall.

Figure 2:
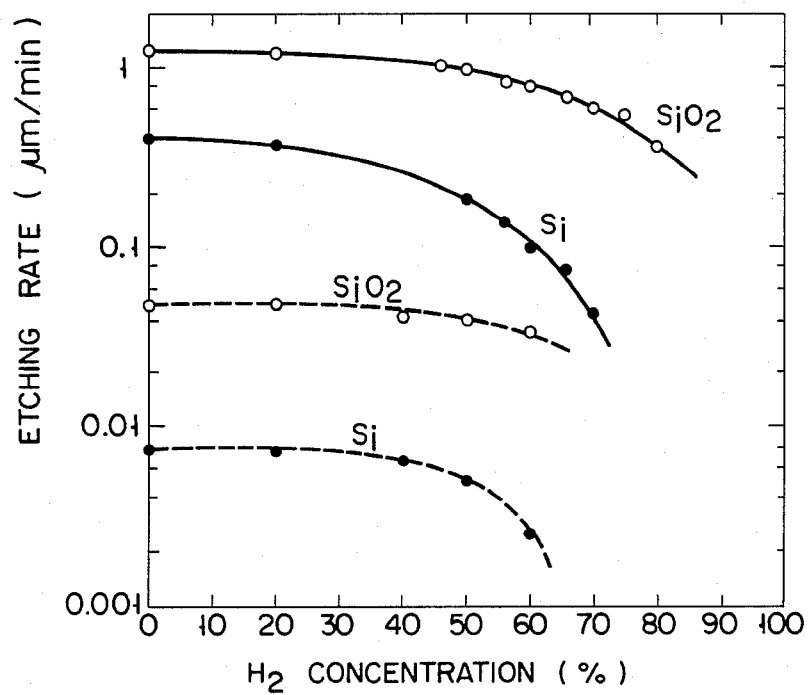
FIG. 2 is a graph illustrating an etching characteristic when $SiO_2$ and Si are etched by a gas mixture of $C_2F_6$ and $H_2$ according to a method of the present invention.

FIG. 2 shows etching characteristics of $SiO_2$ and Si according to a conventional method which does not utilize a magnetic field, and also according to the method of the present invention. A gas mixture of $C_2F_6$ and $H_2$ was used in which the $H_2$ concentration was varied. In the figure, the solid line indicates the etching rate of Si and $SiO_2$ accomplished by the method of the present invention, while the broken line indicates the etching rate of Si and $SiO_2$ accomplished by the conventional method. The etching conditions were the same as those in the experiment described above except for the etchant gas. As is apparent from FIG. 2, the etching rate of the present invention was increased to above ten times that of the conventional method. When the concentration of $H_2$ was about 70%, the selection ratio of $SiO_2$ to Si was above ten times that in the conventional method, accomplishing good selectivity.

Figure 3:
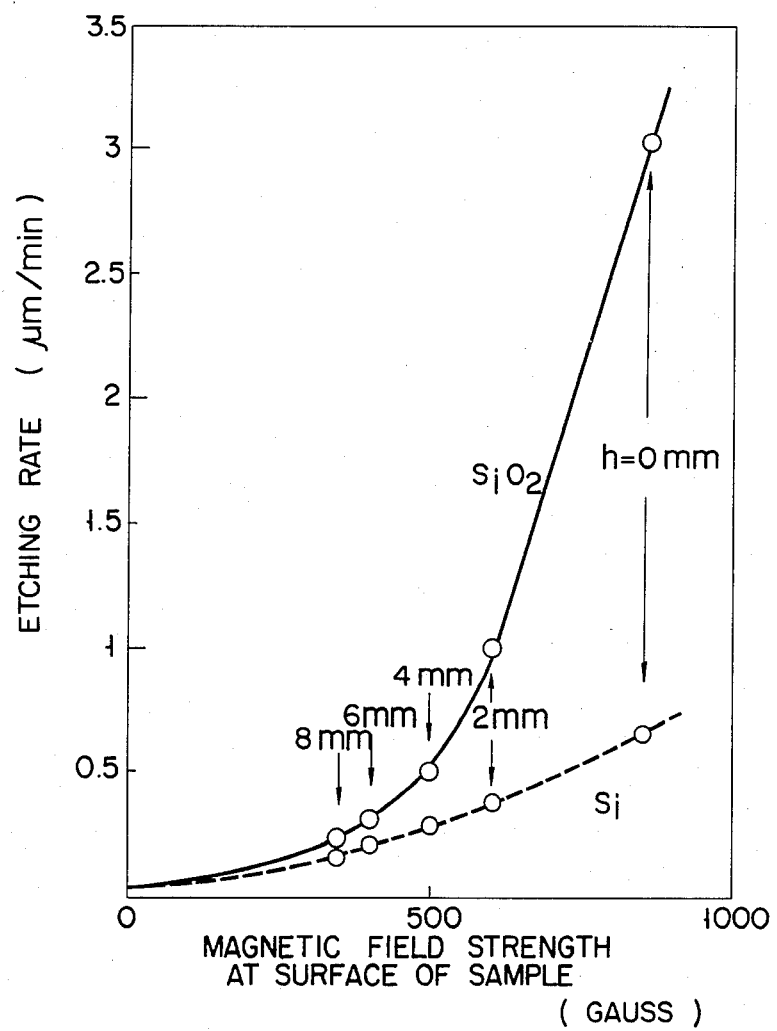
FIG. 3 is a graph for explaining the relation between magnetic field strength on a sample surface and etching rate when $SiO_2$ and Si are etched by a $C_2F_6$ gas according to the method of the present invention.

The present inventors found a phenomenon between the etching rates of $SiO_2$ and Si and the strength of the magnetic field at the surface of the sample to be etched, as shown in FIG. 3. Etching was performed under the conditions that the gas pressure of $C_2F_6$ was 0.04 Torr and the high frequency power was 250 W (0.2 to 0.25 W/cm$^2$). The sample pallet 9 of carbon was placed on the pole piece 6 as shown in FIG. 1, and the magnetic field above the discharge gap 7 on the upper surface of the sample pallet 9 was measured with a Hall sensor. The measured magnetic field strength was plotted as the abscissa of FIG. 3. The strength of the magnetic field was changed with the change in the thickness of the sample pallet 9. The thickness of the sample pallet 9 was given in FIG. 3. As is apparent form the figure, the etching rates of $SiO_2$ and Si increased with an increase in the strength of the magnetic field; the increase in the etching rate of $SiO_2$ was greater than that of the etching rate of Si with an increase in the strength of the magnetic field. As a result, the ratio of the etching rate of $SiO_2$ to that of Si was shown to increase with an increase in the strength of the magnetic field. In order to accomplish selective etching of $SiO_2$ over Si, the strength of the magnetic field in the vicinity of the discharge gap 7 had to be more than about 350 Gauss. When the sample to be etched was directly placed on the pole piece 6 (h=0), extremely high speed etching of Si was performed at a rate of 3 $\mu$m/min. The ratio of the etching rate of $SiO_2$ to that of Si (selective etching ratio SiO$_2$/Si) was about 5 to 6 times. This value was about twice as high as that in the conventional method when SiO$_2$ and Si were etched with the C$_2$F$_6$ gas.

Figure 4:
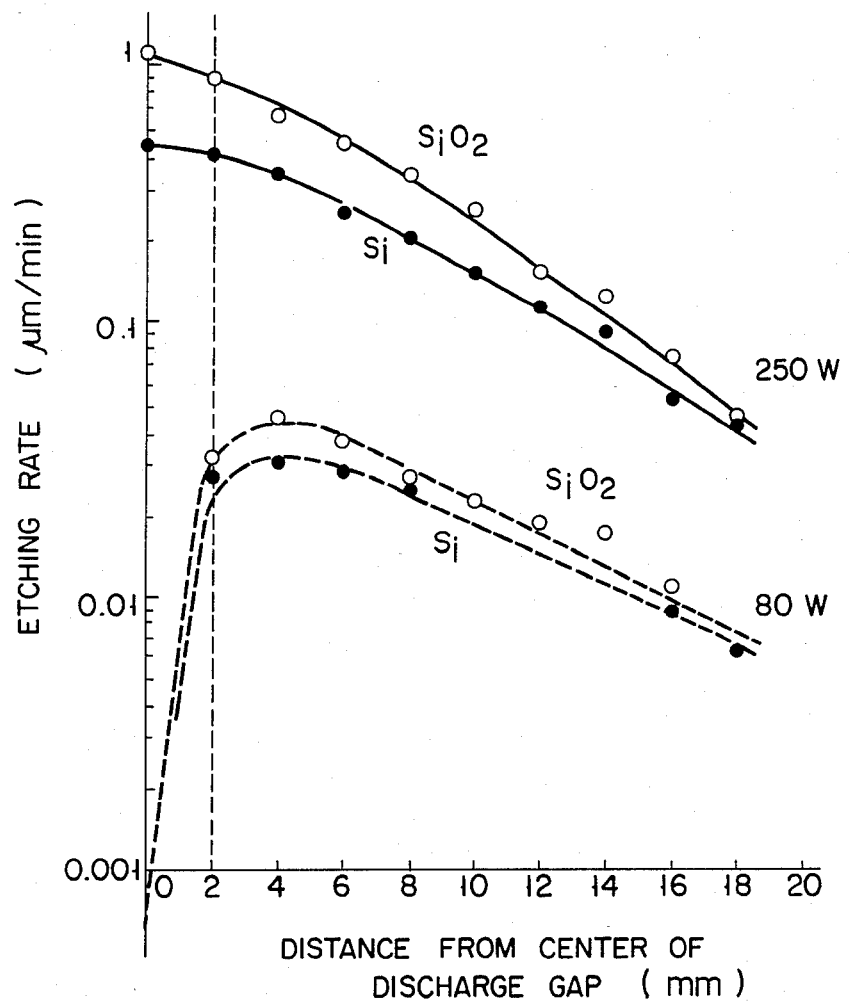
FIG. 4 is a graph explaining the relation between the etching rate and half the distance between N-pole and S-pole of a magnet.

FIG. 4 shows the relation between etching rate and distance from the center of the discharge gap 7 in the horizontal direction in FIG. 1. Etching was performed under the conditions that the gas pressure of C$_2$F$_6$ was 0.04 Torr, the high frequency powers were 250 W (0.2 to 0.25 W/cm$^2$) and 80 W (0.06 to 0.08 W/cm$^2$), and the thickness of the sample pallet 9 was 2 mm. When the high frequency power was 250 W, the etching rates of SiO$_2$ and Si were reduced when the spaces were far from the center of the etching gap 7. With the high frequency power of 80 W, a phenomenon occurred in which the etching rate was extremely low at the center of the discharge gap 7. This may be caused by the deposition.

Figure 5:
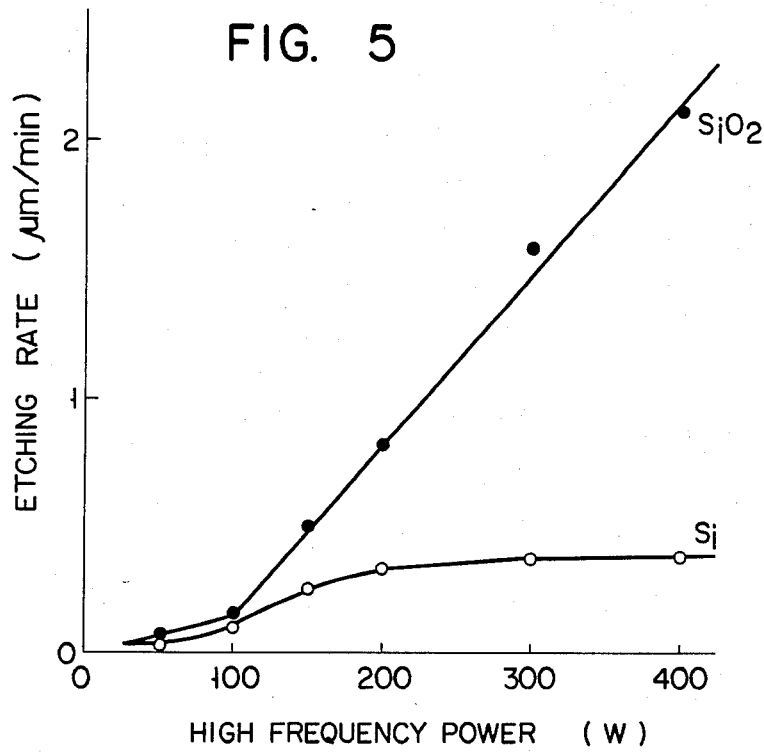
FIG. 5 is a graph for explaining the relation between high frequency power and the etching rate according to the method of the present invention.
Figure 6:
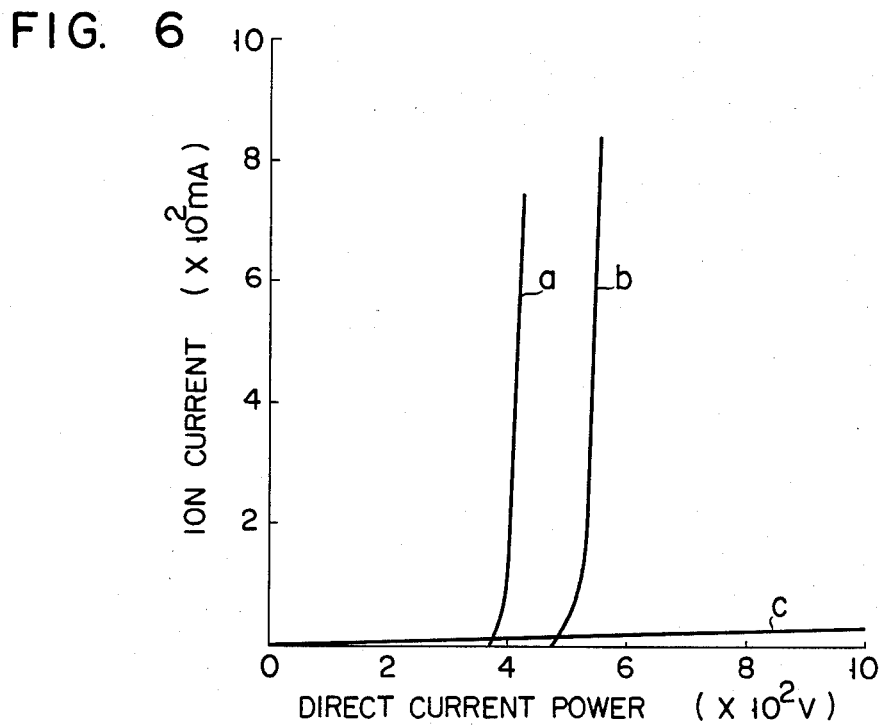
FIG. 6 is a graph for explaining the relation between a voltage and an ion current when direct current power is applied according to the method of the present invention.

As shown in FIG. 5, etching was performed under the same etching conditions as in FIG. 4. Referring to FIG. 5, the etching rate was measured by changing the high frequency power. The power of 250 W corresponded to a power density of 0.2 W/cm$^2$ in this case. The etching rate of the SiO$_2$ greatly increased at about more than 100 W, and the selective etching ratio of the etching rate of SiO$_2$ to that of Si became great. In the etching at the high frequency power of 200 to 400 W as shown in FIG. 5, the cathode fall voltage did not change with the increase in the high frequency power. In this case, the relation between the cathode fall voltage and an ion current was shown by plotting the cathode fall voltage as the abscissa and ion current as the ordinate. A magnetron mode in which the ion current abruptly increases with a change in the cathode fall voltage was observed. The magnetron mode indicates that ions are generated in large amounts. This magnetron mode was also found with direct current as shown in FIG. 6. The cathode was grounded and the plate anode disposed opposite to the pole piece was housed in the reaction chamber and was energized. A sample was placed directly on the pole piece and C$_2$F$_6$ gas was applied. The magnetron mode was established when the C$_2$F$_6$ gas pressure was $2 \times 10^{-3}$ Torr (a) or $7 \times 10^{-4}$ Torr (b), while the magnetron mode was not established when the gas pressure was $3 \times 10^{-4}$ Torr (c).

Figure 7:
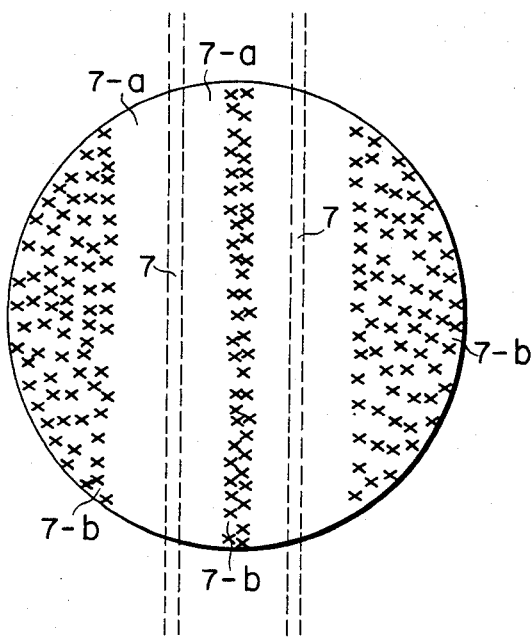
FIG. 7 is a schematic plan view of a surface of a Si sample which is etched in the condition where the position of the sample is fixed relative to a magnetic field.

FIG. 7 is a view of the surface of the sample observed from above, when the Si is etched at the H$_2$ concentration of 70% where the selection ratio of SiO$_2$ to Si as described in FIG. 2 becomes very high. In the example shown in FIG. 2, a Teflon type organic material having a C-F bond was deposited on the entire surface of a wafer of a Si sample which was etched with the H$_2$ concentration exceeding 60% by the conventional method. According to the method of the present invention, as shown in FIG. 7, an organic material was not deposited on areas 7-a having a width of about 1 cm at both sides of the discharge gap 7. On areas 7-b located outside the areas 7-a, the organic material film was deposited, preventing the etching. It was found that plasma areas of high plasma density were present above the discharge gap 7 and the areas 7-a.

The device in which the sample is fixed relative to the magnet as shown in FIG. 1 is not suitable for uniform etching of the entire surface of the sample. However, if a magnetic field line perpendicular to the electric field is made more than 350 Gauss on all the area between the discharge gaps 7 by narrowing the distance between the discharge gaps 7 even when the relative positions of the sample and the magnet are fixed, that is, if the areas 7-a overlap in FIG. 7, uniform etching may be accomplished.

Figure 8:
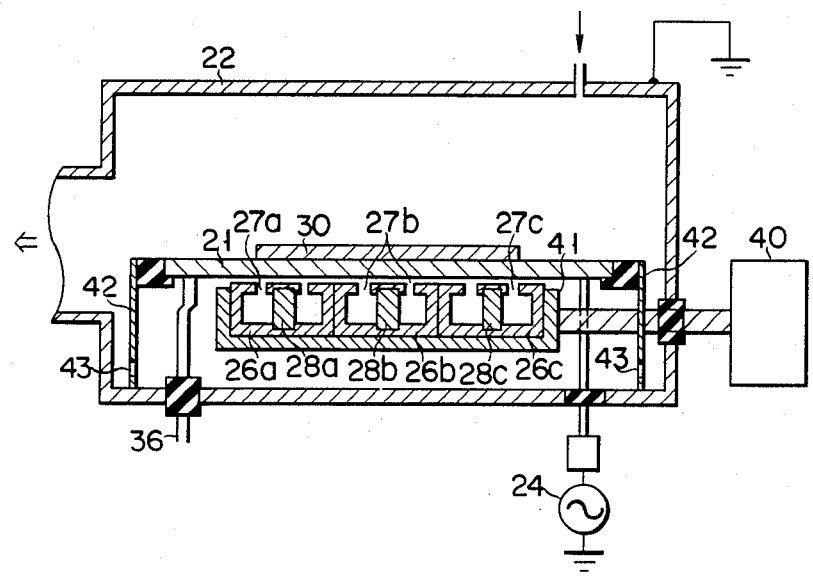
FIG. 8 is a schematic sectional view of one embodiment of the dry etching device according to the present invention.

FIGS. 8 to 11 show a device which performs uniform etching by changing the relative positions of the sample to be etched and the magnet. Referring to FIG. 8, a plurality of permanent magnets 28a, 28b and 28c are respectively disposed in pole pieces 26a, 26b and 26c which are made of magnetic material. The pole pieces 26a, 26b and 26c are mounted in a box type container 41 which is coupled to a motor 40 so that the box type container 41 is linearly, reciprocally driven by the motor 40. A cathode 21 is made of nonmagnetic material and spaced apart from the magnets and the pole pieces. The lower part of the cathode 21 which houses the magnets 28a, 28b and 28c is surrounded by a dark space shield 42 in order to avoid discharging below the cathode 21. A vent hole 43 is formed at the dark space shield 42 in order to vent the lower part of the cathode 21 which houses the permanent magnets 28a, 28b and 28c. The device of FIG. 8 is the same as that of FIG. 1, including water cooling means 36 of the cathode 21, and a high frequency power source 24, except for items otherwise specified. According to the device of FIG. 8, the surface of a sample 30 may be scanned by magnetic fields induced at the discharge gaps 27 of the pole pieces 26 by the permanent magnets 28 during etching, so that uniform etching may be performed at high speed. In this case, preferable etching is accomplished by narrowing the distance between the discharge gaps and by overlapping the magnetic fields.

Figure 9:
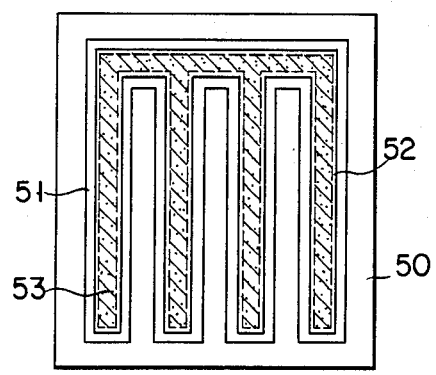
FIG. 9 is a plan view of one embodiment of a magnetic field inducing means.

FIG. 9 shows another embodiment of the magnetic field inducing means. A discharge gap 51 of closed loops is formed at a pole piece 50. A permanent magnet 53 which has the same shape as a part 52 of the pole piece 50 which is surrounded by the discharge gap 51 is placed beneath the part 52 of the pole piece 50. According to this magnetic field inducing means, a plurality of discharge gaps may be transversely formed as closely as possible, so that overlapped magnetic fields may easily be induced.

Figure 10:
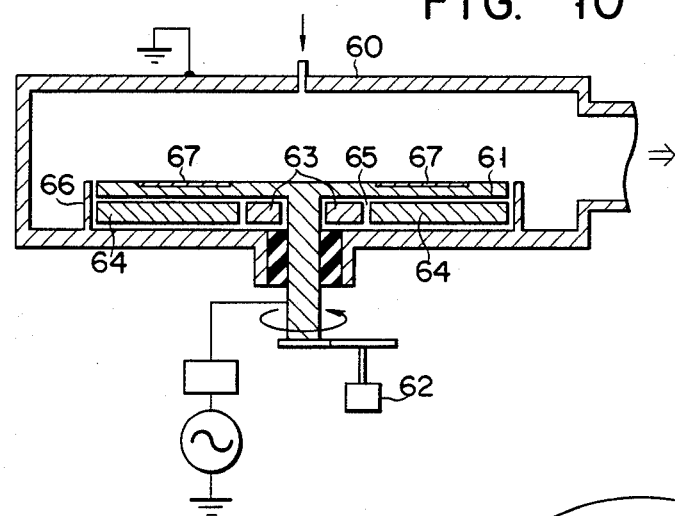
FIG. 10 is a schematic sectional view of another embodiment of the dry etching device according to the present invention.
Figure 11:
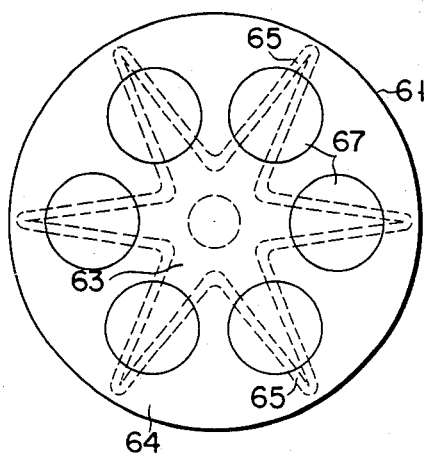
FIG. 11 is a plan view of the cathode and the magnetic field inducing means which are used for the dry etching device of FIG. 10.

FIGS. 10 and 11 show still another embodiment of the device in which a sample to be etched is rotated over the discharge gaps. A disk cathode 61 is rotatable in the reaction chamber having an anode 60. A permanent magnet 63 of star shape, the N-pole of which faces upward, and a permanent magnet 64 which surrounds the permanent magnet 63, the S-pole of which faces upward, are mounted below the cathode 61. A discharge gap 65 of closed loops is formed between the permanent magnets 63 and 64. A dark space shield 66 is formed on the side surfaces of the cathode 61 and the permanent magnets 63 and 64. Samples to be etched 67 is placed on the cathode 61. The samples 67 are etched by rotating the cathode 61 by a motor 62 and supplying high frequency power to form a plasma with an etchant gas flowing through the inlet port. Since the entire part of the samples 67 rotates passing over the discharge gap 65, uniform etching is accomplished.

The influences of the strength of the magnetic field and the power density of the high frequency power on the etching is described with reference to FIGS. 12 and 13. An experiment was conducted with the device of FIG. 8, in which SiO$_2$ and Si samples were etched by using a CHF$_3$ of 0.05 Torr.

Figure 12:
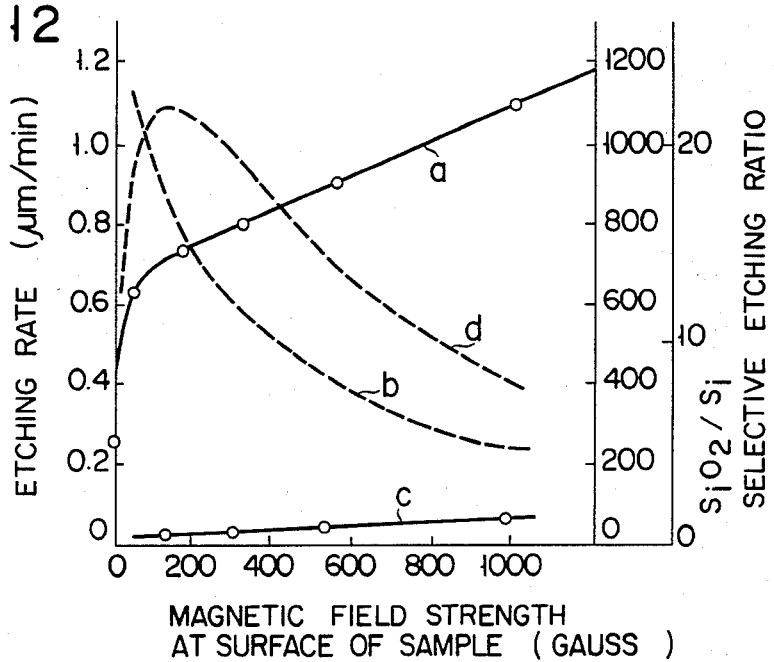
FIG. 12 is a graph for explaining relations among the magnetic field strength on the sample surface, the etching rate and $SiO_2/Si$ selection ratio when $SiO_2$ and Si are etched by the $CHF_3$ gas according to the method of the present invention.

The etching results are shown in FIG. 12, in which the etching was performed at a power density of 1.6 W/cm$^2$, a few times higher than the preferable power density of 0.2 to 0.5 W/cm$^2$ in the conventional dry etching which does not utilize a magnetic field. As is apparent from FIG. 12, the etching rate (a) of SiO2 abruptly increases at first and continues to increase at a constant gradient with an increase in the strength of the magnetic field. At the same time, the cathode fall voltage (b) abruptly decreases with the increase in the strength of the magnetic field. This depends on a decrease in the radius of the helical track of the electrons so that ionization is performed close to the surface of the cathode. Therefore, the accumulation rate of ions in the cathode increases in correspondence with the increase in the strength of the magnetic field, and spaces where the plasma density is very high are partially formed in the vicinity of the discharge gap. This also indicates that damage to the substrate is gradually reduced in accordance with the increase in the strength of the magnetic field. On the other hand, the etching rate (c) of Si linearly increases, so that the SiO2/Si selective etching ratio (d) is maximum near when the etching rate (a) of SiO2 begins to change.

As is apparent from FIG. 12, the increase in the etching rate of SiO2 by magnetron discharge at the high frequency power of 1.6 W/cm$^2$ is found with a magnetic field strength of more than 50 Gauss. The cathode fall voltage corresponding to the magnetic field strength of 50 Gauss is about 1,000 V, so that damage caused by ions is relatively small and may be neglected. With the magnetic field strength of 50 Gauss, the ratio of the etching rate of SiO2 to that of Si is more than 10:1, so that only SiO2 is selectively etched. The same experiment as in FIG. 12 was performed under the following etching conditions: the power density of the high frequency power was, respectively, 0.4 W/cm$^2$, 0.2 W/cm$^2$ and 0.1 W/cm$^2$; and the magnetic field strength on the surface of the sample which accomplished the high speed etching of SiO2 was, respectively, more than 200 Gauss, 600 Gauss and 1,000 Gauss.

Figure 13:
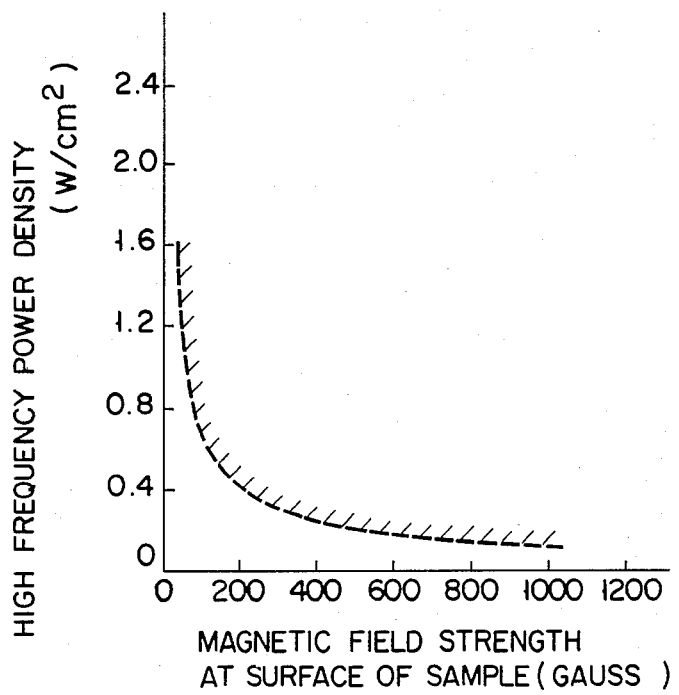
FIG. 13 is a graph for explaining the relation between the magnetic field strength at the sample surface and the high frequency power.

FIG. 13 shows the relation between the high frequency power density and the magnetic field strength at the surface of the sample. The broken line is obtained by connecting the coordinate points corresponding to the results of the experiments. Higher density of the plasma was produced by etching under the conditions indicated by the hatched part of FIG. 13 and high speed etching was accomplished. When the etching was performed under the conditions indicated by the hatched part, damage to Si substrate caused by ions was reduced to the minimum and selective etching was accomplished effectively.

In the description above, the etching for SiO2 and Si is mainly described; but the method of the present invention may be applied to a polycrystalline silicon, aluminum or an alloy thereof, or a slicide such as molybdenum silicide.

In the embodiment described above, the etchant gas used for the method of the present invention was exemplified by a gas containing fluorine, such as CF4 However, other reactive gases containing chlorine or bromine may be used. For example, CCl4 and CCl4+Cl2 gases may be used for aluminum, an aluminum alloy or the like; and CBrF3, CBrF3+Cl2, and Cl2 gases may be used for polycrystalline silicon, molydenum silicide or the like. In this manner, high speed etching with high reliability and good selectivity as has been accomplished with SiO2 are accomplished for various materials to be etched. In the embodiment of the present invention described above, the sample is cooled along with the cathode and the permanent magnet. Furthermore, other methods than cooling by water or alcohol, liquefied gas such as Freon may be used to prevent the photoresist film from becoming damp in the high speed etching.

An electromagnet may also used in place of the permanent magnet.

In summary, according to the method and device of the present invention, a magnet having a gap of the closed loops is placed on or beneath a cathode and electrons perform magnetron movement by magnetic and electric fields which are perpendicular to each other and which are induced by the cathode or the magnet. Therefore, the discharge efficiency is incresed so that high speed etching is performed for a material placed on the cathode or the magnet, greatly increasing productivity. The dry etching method according to the present invention is utilized in contact hole formation and patterning of electrodes and wiring of a semiconductor device such as MOS devices and bipolar devices.

What we claim is:

1. A dry etching method comprising the steps of:
supplying power between a cathode and an anode;
generating a plasma of a reactive etchant gas containing halogen within a reaction chamber;
placing a sample composed of a layer to be etched and an etching mask formed thereon on said cathode;
etching said sample by ions attracted from said plasma toward said cathode;
inducing a magnetic field having field lines perpendicular to an electric field created by said step of supplying power between said cathode and said anode whereby said field lines are perpendicular to said electric field at a surface of said sample to be etched and whereby a plurality of high plasma density areas are formed at the surface of said cathode which areas overlap each other.

2. A method according to claim 1, wherein a magnetron mode is generated by the magnetic and electric fields which are mutually perpendicular.

3. A method according to claim 1, wherein the magnetic field is induced by a permanent magnet or an electromagnet and the sample to be etched is moved relative to the magnet during etching.

4. A method according to claim 1, wherein said halogen is one selected from the group consisting of fluorine, chlorine and bromine.

5. A method according to claim 4, wherein said etchant gas is one selected from the group consisting of CF4, CCl4, CCl4+Cl2, CBrf3, CBrf3+Cl2 and Cl2.

6. A dry etching method comprising the steps of:
supplying power between a cathode and an anode;
generating a plasma of a reactive etchant gas containing halogen within a reaction chamber;
placing on said cathode a sample having a layer to be etched and an etching mask formed thereon;
etching said sample by ions attracted from said plasma toward said cathode; and
inducing a magnetic field having field lines perpendicualr to an electric field created by said step of supplying power between said cathode and said anode whereby said field lines are perpendicular to said electric field at a surface of said sample being etched and whereby the etching is performed under the conditions indicated by an area inside a curve obtained by connecting points of coordinates X=50 Gauss and Y=1.6 W/cm$^2$, X=200 Gauss and Y=0.4 W/cm$^2$, X=600 Gauss and Y=0.2

W/cm², and X=1,000 Gauss and Y=0.1 W/cm², where X denotes a magnetic field strength at the surface of the sample and Y denotes high frequency power density, and whereby a plurality of high plasma density areas which are formed at the surface of said cathode overlap each other.

7. A method according to claim 6, wherein the magnetic field is induced by a permanent magnet or an electromagnet and the sample to be etched is moved relative to the magnet during etching.

8. A method according to claim 6, wherein a magnetron mode is generated by the magnetic and electric fields which perpendicular to each other.

9. A dry etching device comprising:
   a reaction chamber having disposed therein an anode, a cathode and a sample having a layer to be etched and an etching mask formed thereon wherein said sample is placed on said cathode;
   means for introducing a reactive etchant gas containing halogen in said reaction chamber;
   means for supplying power between said anode and said cathode so that said sample is etched by ions attracted from a plasma generated in said chamber toward said cathode;
   means for inducing a magnetic field having field lines perpendicular to an electric field created by said means for supplying power and said anode and said cathode; and
   means for changing relative positions of said sample and said means for inducing said magnetic field.

10. A device according to claim 9, wherein said means for inducing the magnetic field has a discharge gap of closed loops, an inner part and an outer part of the discharge gap are opposite magnetic poles, and a magnetic field is induced between said inner and outer parts.

11. A device according to claim 10, wherein a magnet is mounted within a pole piece of magnetic material, and the discharge gap is formed in the surface of the pole piece.

12. A device according to claim 10, wherein two magnets are disposed inside and outside relative to each other to define the discharge gap therebetween.

13. A device according to claim 10, wherein the entire sample passes over the discharge gap by said means for changing the relative positions of the sample and the means for inducing the magnetic field.

* * * * *